United States Patent
Tseng

(10) Patent No.: US 7,514,771 B2
(45) Date of Patent: *Apr. 7, 2009

(54) LEADLESS LEAD-FRAME

(75) Inventor: Chao-Ming Tseng, Kaohsiung County (TW)

(73) Assignee: Advanced Semiconductor Engineering, Inc., Kaoshiung (TW)

(*) Notice: Subject to any disclaimer, the term of this patent is extended or adjusted under 35 U.S.C. 154(b) by 130 days.

This patent is subject to a terminal disclaimer.

(21) Appl. No.: 11/704,997

(22) Filed: Feb. 12, 2007

(65) Prior Publication Data

US 2007/0164406 A1 Jul. 19, 2007

Related U.S. Application Data

(63) Continuation of application No. 10/876,458, filed on Jun. 28, 2004, now Pat. No. 7,193,302.

(30) Foreign Application Priority Data

Dec. 31, 2003 (TW) .............................. 92137725 A

(51) Int. Cl.
*H01L 23/02* (2006.01)

(52) U.S. Cl. ...................................................... 257/678
(58) Field of Classification Search ................. 257/666, 257/678, 690, E23.01, E23.061
See application file for complete search history.

(56) References Cited

U.S. PATENT DOCUMENTS

| 6,713,849 | B2  |   | 3/2004 | Hasebe et al. |
| 7,196,409 | B2  | * | 3/2007 | Den Ouden ................. 257/690 |
| 2002/0027297 | A1 |   | 3/2002 | Ikenaga et al. |
| 2004/0041242 | A1 |   | 3/2004 | Joshi |

* cited by examiner

*Primary Examiner*—Nathan W Ha
(74) *Attorney, Agent, or Firm*—Bacon & Thomas, PLLC

(57) ABSTRACT

A leadless lead-frame mainly includes a chip paddle and a plurality of leads. The chip paddle has chip disposal areas, and a grounding area surrounding the chip disposal area. The grounding area has a recession with a recession-bottom and a recession-wall connecting to the recession-bottom. An angle is formed between the recession-wall and the recession-bottom, and the angle is less than 90 degrees. The leads surround the chip paddle. The chip paddle has a cavity and the cavity has a cavity-bottom serving as the chip disposal area, and the depth of the cavity is equal to half of the thickness of the chip paddle.

12 Claims, 3 Drawing Sheets

LEADLESS LEAD-FRAME

This is a Continuation of application Ser. No. 10/876,458, filed on Jun. 28, 2004, the entire disclosure of which is hereby incorporated by reference.

BACKGROUND OF THE INVENTION

1. Field of Invention

This invention relates to a leadless semiconductor package. More particularly, the present invention is related to a leadless semiconductor package with high reliability of the attachment of the encapsulation to the leadless lead-frame.

2. Related Art

Integrated circuits (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits. Nowadays, ball grid array package (BGA) and chip scale package (CSP) are wildly applied to chip package with high I/Os and assembly package for thermal enhance integrated circuits.

However, assembly package with lead frame possesses great marketing for that it can provide low-cost solutions for current semiconductor package. Due to lead frame with long inner leads and outer leads, such conventional lead-frame assembly package can not applied to chip scale package and low profile package. Thus leadless assembly package, such as Quad-Flat-Non-lead Package which is initially developed by Matsushita, is wildly provided in the semiconductor package industry to reduce the size of the assembly package in the recent years. Referring to FIG. 1, a conventional leadless assembly package is disclosed. The leadless semiconductor package 100 mainly comprises a leadless lead-frame 110 such as a copper lead-frame, a chip 120, an adhesive 130, a plurality of conductive wires 140 and an encapsulation 150. Therein, the leadless lead-frame 110 has a chip paddle 112 and a plurality of leads 114 surrounding the chip paddle 112; and the chip paddle 112 comprises a chip disposal area 112a and a grounding area 112b; and the chip 120 is disposed above the chip disposal area 112a through an adhesive 130, such as silver paste, connecting the back surface 122 of the chip 120 and the chip disposal area 112a. Moreover, the chip 120 further has an active surface 124 and a plurality of bonding pads 126 formed on the active surface 124; and the chip 120 is electrically connected to the top 114a of the lead 114 and the grounding area 112b of the chip paddle 112 through the conductive wires 140, such as gold wires. And the encapsulation 150, such as molding compound, encapsulates the leadless lead-frame 110, the chip 120 and the conductive wires 130 and exposes the bottom 112c of the chip pad 112 and the bottom 114b of the leads 114 so as to form a plurality of electrical terminals to connect to external electronic devices through surface mount technology (SMT).

As mentioned above, the chip paddle 112 of said leadless semiconductor package 100 exposes the bottom 112c and 114b of the leadless semiconductor package 100 so as to further improve the thermal performance of said leadless semiconductor package. Furthermore, due to the short leads, the impedance will be lower. Accordingly, the leadless semiconductor package is especially adapted to the assembly package with high-frequency devices, which are performed at the frequency from 10 GHz to 100 GHz, enclosed therein. In such a manner, such leadless semiconductor package has low cost and competitive price. Therefore the leadless semiconductor package is adapted to cell phone, personal digital application (PDA), digital camera and information application (IA).

As can be seen, the reliability of said leadless semiconductor package is relied upon the performance of the attachment of the encapsulation 150 to the lead frame 110. Namely, when the encapsulation 150 is able to well encapsulate the lead frame 110, the leadless semiconductor package will have a better reliability. However, usually the reliability of the leadless semiconductor package is lowered due to the change of working temperature. Namely, the encapsulation 150 is usually caused to be separated from the lead frame 110 upon the difference of the thermal coefficient of expansion of the lead frame 110 from that of the encapsulation 150 and the changes of the working temperature. Besides, referring to FIG. 1 again, an adhesive 130 is interposed between the chip disposal area 112a and the back surface 122 of the chip 120 to have the chip 120 securely attached to the chip paddle 112. However, when the adhesive 130 is an epoxy resin or a silver paste and the size of the chip 120 is slightly smaller than the size of the chip paddle 112, the adhesive 130 is easily to flash over and flow over the grounding area 112b. Specifically, when the distance between the periphery 128 of the chip 120 and the periphery of the chip paddle 112, namely the width D of the grounding area 112b, is not greater than six (6) mils, exceeding adhesive will more easily flash over and flow over the grounding area 112b so that the conductive wires 130 will not be well bonded to the grounding area 112b and the reliability of said package will be lowered.

Consequently, providing another leadless lead-frame to solve the mentioned-above disadvantages is the most important task in this invention.

SUMMARY OF THE INVENTION

In view of the above-mentioned problems, this invention is to provide a leadless semiconductor package with high reliability of the attachment of the encapsulation to the leadless lead-frame. Moreover, this invention is also to provide a leadless semiconductor package with high reliability of the attachment of the chip to the leadless lead-frame.

To achieve the above-mentioned, a leadless lead-frame is provided, wherein the leadless lead-frame mainly comprises a chip paddle and a plurality of leads. The chip paddle has chip disposal areas, and a grounding area surrounding the chip disposal area. The grounding area has a recession with a recession-bottom and a recession-wall connecting to the recession-bottom. An angle is formed between the recession-wall and the recession-bottom, and the angle is less than 90 degrees. The leads surround the chip paddle. The chip paddle has a cavity and the cavity has a cavity-bottom serving as the chip disposal area, and the depth of the cavity is equal to half of the thickness of the chip paddle.

To achieve the above-mentioned, a package is provided, wherein the package comprises a lead-fram and a chip. The leadless lead-frame mainly comprises a chip paddle and a plurality of leads. The chip paddle has chip disposal areas, and a grounding area surrounding the chip disposal area. The grounding area has a recession with a recession-bottom and a recession-wall connecting to the recession-bottom. An angle is formed between the recession-wall and the recession-bottom, and the angle is less than 90 degrees. The leads surround the chip paddle. The chip paddle has a cavity and the cavity has a cavity-bottom serving as the chip disposal area, and the depth of the cavity is equal to half of the thickness of the chip paddle. The chip is disposed in the cavity of the chip paddle of the lead-frame and attached to the lead-frame. The chip has an active surface and a back surface opposed to the active surface.

Besides, as mentioned above, a chip is placed in the cavity so that the total thickness of the package comprising the leadless lead-frame will become smaller. Accordingly, there is a thinner leadless semiconductor package provided.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The leadless lead-frame according to the preferred embodiments of this invention will be described herein below with reference to the accompanying drawings, wherein the same reference numbers refer to the same elements.

Figure 1:
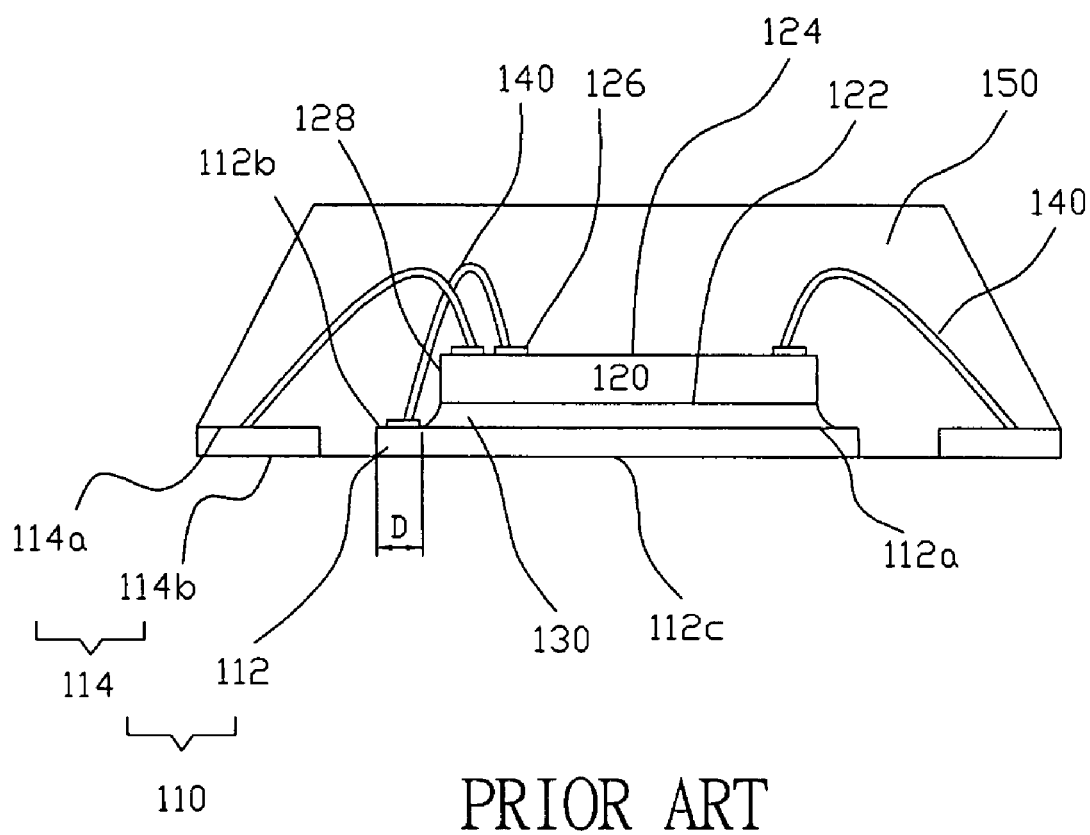
FIG. 1 is a cross-sectional view of the conventional leadless semiconductor package.
Figure 2:
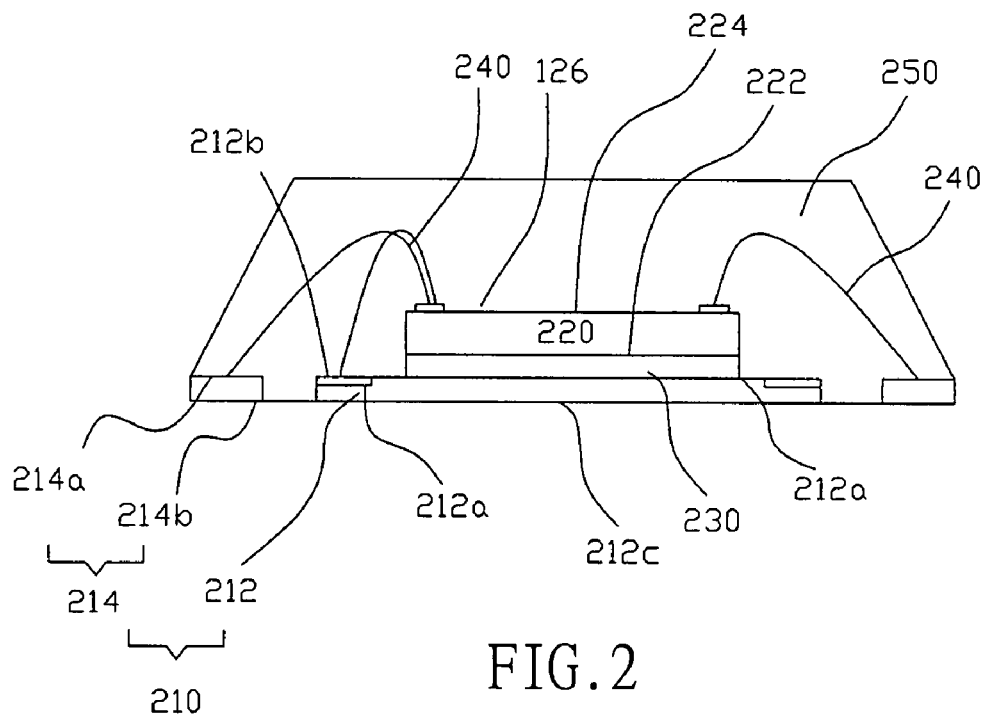
FIG. 2 is a cross-sectional view of a leadless semiconductor package according to the first embodiment of the present invention.

In accordance with a first preferred embodiment as shown in FIG. 2, there is provided a leadless semiconductor package. The leadless semiconductor package mainly comprises a lead frame 210, a chip 220, an adhesive 230 and a plurality of electrically conductive wires 240. Therein, the lead frame 210, such as a leadless lead-frame, has a chip paddle 212 and a plurality of leads 214 surrounding the chip paddle 212. Moreover, the chip paddle 212 has a chip disposal area 212a and a grounding area 212b surrounding the chip disposal area 212a, and the grounding area 212b at least has a recession 213. Besides, the chip 220 has a back surface 222 and an active surface 224 and the chip 220 is placed in the chip disposal area 212a of the chip paddle 212 through the adhesive 230. In addition, the electrically conductive wires 240 are electrically bonded to the grounding area 212b and the leads 214 respectively. Furthermore, an encapsulation 250, such as molding compound, is provided to encapsulate the chip 220, the wires 240, the chip disposal area 212a and the grounding area 212b of the chip paddle 212 and the top 214b of the lead 214 and expose the bottom 214b of each lead 214 and the bottom 212c of the chip paddle 212 to form electrical terminals for connecting to external electronic devices. To be noted, in this embodiment, the chip disposal area 212a is a flat plane and substantially coplanar with the grounding area 212b. Besides, in order to enhance the attachment of the wires 240 to the grounding area 212b and the leads 214, there is generally a metal layer, such as a silver metal layer, formed thereon.

Figure 3:
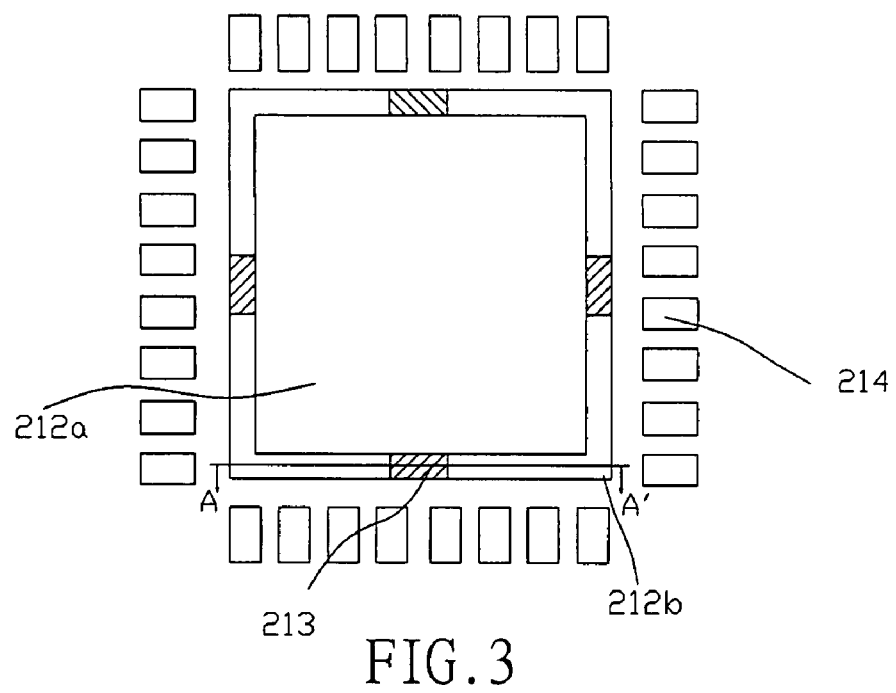
FIG. 3 is a top view of the lead frame according to the first embodiment of FIG. 2.
Figure 4:
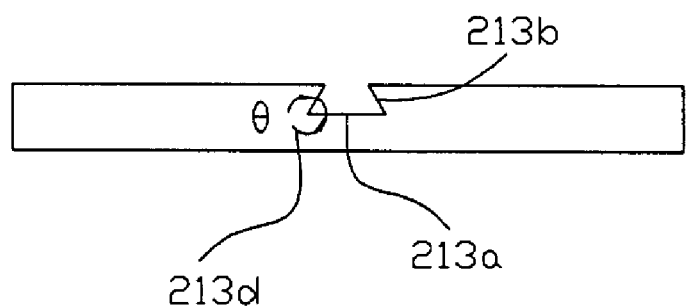
FIG. 4 is a cross-sectional view along line AA' of the chip paddle of the lead frame according to the first embodiment of FIG. 3.

Furthermore, referring to FIG. 3 and FIG. 4, and FIG. 4 illustrates the cross-sectional view along AA' of the chip paddle 212 shown in FIG. 3. Therein, the recession 213 has a recession-bottom 213a, recession-wall 213b connecting the recession-bottom 213a, wherein an angle 213d is formed between the recession-bottom 213a and the recession-wall 213b. To be noted, the recession-bottom 213a can be non-orthogonal to the recession-wall 213b by the design of etching-mask and controlling the etching time. Namely, the angle 213d is less than 90 degree. In such a design, the recession-wall 213b is shaped into a slant wall to increase the contact area of the lead frame 210 to the encapsulation 220. Recession-bottom 213a and recession wall 213b are also illustrated in FIG. 2.

Figure 5:
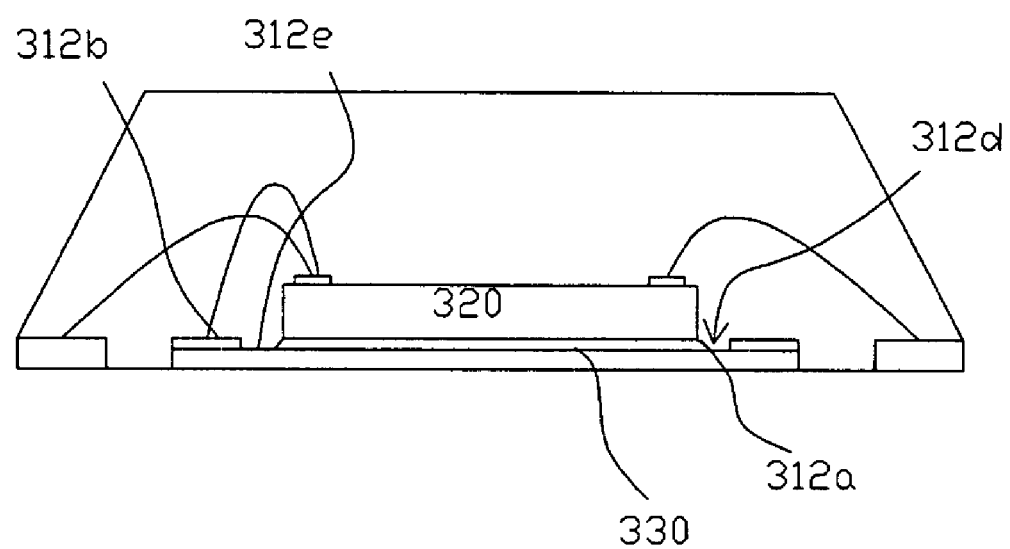
FIG. 5 is a cross-sectional view of a leadless semiconductor package according to the second embodiment of the present invention.

Referring to FIG. 5, it shows the second embodiment of this invention. To be noted and what is the difference of this embodiment from the first one is that the chip disposal area 312a is below the grounding area 312b so as to have the grounding area 312b protruded from the chip disposal area 312a and form a cavity 312d to be compassed by the grounding area 312b. In such a manner, the cavity 312d having a cavity-bottom 312e to be served as the chip disposal area 312a is able to accommodate more and more adhesive to prevent exceeding adhesive from flashing over the grounding area 312b.

As mentioned above, usually the depth of the chip disposal area 312a is about half of the thickness of the chip paddle 310. Thus, when the chip 320 is placed in the chip disposal area 212a through an adhesive 330 disposed in the chip disposal area 312a, the adhesive 330 could be well controlled in the chip disposal area 312a due to the grounding area 312b be protruded from the chip disposal area 312a. In such a manner, the wires 340 will be well bonded to the grounding area 212b. In addition, because the chip 320 is placed in the chip disposal area 312a, the top of the wires connecting the leads 314 or the grounding area 312b will be lowered to shorten the length of the wires and lower the impedance of the wires. Accordingly, the electrical performance will be enhanced. Besides, the chip is placed in the chip disposal area so that the total thickness of the package will become smaller. Accordingly, there is a thinner leadless semiconductor package provided. Although the chip 320 is electrically connected to the leads 314 through the electrically conductive wires, the chip 320 is also able to be electrically connected to the leads through bumps by flip-chip bonding method, such as gold bumps and solder bumps.

Although the invention has been described in considerable detail with reference to certain preferred embodiments, it will be appreciated and understood that various changes and modifications may be made without departing from the spirit and scope of the invention as defined in the appended claims.

What is claimed is:

1. A leadless lead-frame comprising:
   a chip paddle having chip disposal areas, and a grounding area surrounding the chip disposal area, wherein the grounding area having a recession with a recession-bottom and a recession-wall connecting to the recession-bottom, an angle is formed between the recession-wall and the recession-bottom and the angle is less than 90 degrees; and
   a plurality of leads surrounding the chip paddle, the chip paddle having a cavity and the cavity having a cavity-bottom serving as the chip disposal area, and the depth of the cavity is equal to half of the thickness of the chip paddle.

2. The leadless lead-frame of claim 1, wherein the recession-wall is a slant wall.

3. The leadless lead-frame of claim 1, wherein the depth of the cavity is at least greater than half of the thickness of the chip paddle.

4. The leadless lead-frame of claim 1, wherein the grounding area protrudes from the chip disposal area.

5. The leadless lead-frame of claim 1, wherein the chip disposal area is a flat plan and substantially coplanar with the grounding area.

6. A package, comprising:
   a lead-frame, comprising:
   a chip paddle having chip disposal areas, and a grounding area surrounding the chip disposal area, wherein the grounding area having a recession with a recession-bottom and a recession-wall connecting to the recession-bottom, an angle is formed between the recession-wall and the recession-bottom and the angle is less than 90 degrees; and
   a plurality of leads surrounding the chip paddle, the chip paddle having a cavity and the cavity having a cavity-bottom serving as the chip disposal area, and the depth of the cavity is equal to half of the thickness of the chip paddle; and a chip disposed in the cavity of the chip paddle of the lead-frame and attached to the lead-frame, and the chip having an active surface and a back surface opposed to the active surface.

7. The package of claim 6, further comprising:
a plurality of first electrically conductive wires electrically connect the leads and the chip.

8. The package of claim 7, wherein the first electrically conductive wires comprises a plurality of gold wires.

9. The package of claim 6, further comprising:
a plurality of second electrically conductive wires electrically connect the grounding area and the chip.

10. The package of claim 9, wherein the second electrically conductive wires comprises a plurality of gold wires.

11. The package of claim 6, further comprising:
an adhesive disposed in the cavity and interposed between the chip and the chip paddle.

12. The package of claim 11, wherein said adhesive is made of silver paste.

* * * * *